(12) United States Patent
Chaudhuri

(10) Patent No.: US 10,317,464 B2
(45) Date of Patent: Jun. 11, 2019

(54) DYNAMIC SCAN CHAIN RECONFIGURATION IN AN INTEGRATED CIRCUIT

(71) Applicant: Xilinx, Inc., San Jose, CA (US)

(72) Inventor: Partho Tapan Chaudhuri, Nagpur (IN)

(73) Assignee: XILINX, INC., San Jose, CA (US)

( * ) Notice: Subject to any disclaimer, the term of this patent is extended or adjusted under 35 U.S.C. 154(b) by 4 days.

(21) Appl. No.: 15/589,644

(22) Filed: May 8, 2017

(65) Prior Publication Data

US 2018/0321306 A1  Nov. 8, 2018

(51) Int. Cl.
*G01R 31/317* (2006.01)
*G01R 31/3177* (2006.01)
*G01R 31/3185* (2006.01)
*G01R 31/3187* (2006.01)
*G06F 11/267* (2006.01)
*G06F 11/27* (2006.01)

(52) U.S. Cl.
CPC ..... *G01R 31/3177* (2013.01); *G01R 31/3187* (2013.01); *G01R 31/31723* (2013.01); *G01R 31/31724* (2013.01); *G01R 31/318536* (2013.01); *G01R 31/318544* (2013.01); *G01R 31/318558* (2013.01); *G06F 11/267* (2013.01); *G06F 11/27* (2013.01)

(58) Field of Classification Search
CPC .............................................. G01R 31/318555
USPC ........................................ 214/726, 733, 729
See application file for complete search history.

(56) References Cited

U.S. PATENT DOCUMENTS

| | | | |
|---|---|---|---|
| 5,550,843 A | 8/1996 | Yee | |
| 5,592,493 A | 1/1997 | Crouch et al. | |
| 5,675,589 A | 10/1997 | Yee | |
| 6,044,025 A | 3/2000 | Lawman | |
| 6,071,314 A | 6/2000 | Baxter et al. | |
| 6,134,517 A | 10/2000 | Baxter et al. | |
| 6,226,779 B1 | 5/2001 | Baxter et al. | |
| 6,539,510 B1 | 3/2003 | St. Pierre, Jr. | |
| 6,857,092 B1 | 2/2005 | Fox | |
| 7,117,416 B1 | 10/2006 | Fox | |
| 7,216,277 B1 | 5/2007 | Ngai et al. | |
| 7,302,625 B1 | 11/2007 | Payakapan et al. | |
| 7,308,656 B1 | 12/2007 | Roberts et al. | |
| 7,345,507 B1 | 3/2008 | Young et al. | |
| 7,383,478 B1 | 6/2008 | Ballagh et al. | |
| 7,409,610 B1 | 8/2008 | Drimer | |
| 7,451,369 B1 | 11/2008 | Oh et al. | |
| 7,610,534 B1 | 10/2009 | Jacobson | |
| 7,747,423 B1 | 6/2010 | Shirazi et al. | |
| 7,917,820 B1 | 3/2011 | Pavle et al. | |
| 7,958,414 B1 | 6/2011 | Ansari et al. | |
| 8,063,654 B2 | 11/2011 | Rahman et al. | |
| 8,311,762 B1 | 11/2012 | Hartanto et al. | |
| 8,438,436 B1 * | 5/2013 | Baker ............ | G01R 31/318588 714/34 |
| 8,933,345 B1 | 1/2015 | Rahman | |
| 9,128,148 B2 | 9/2015 | Lowney et al. | |
| 2001/0049806 A1 * | 12/2001 | Porteners ........... | G01R 31/3167 714/724 |
| 2013/0185607 A1 | 7/2013 | Tekumalla et al. | |
| 2014/0101501 A1 | 4/2014 | Devta Prasanna et al. | |
| 2014/0372818 A1 | 12/2014 | Rajski et al. | |
| 2015/0185285 A1 * | 7/2015 | Kovalev ........ | G01R 31/318572 714/727 |
| 2015/0276871 A1 * | 10/2015 | Ren ................ | G01R 31/318552 714/727 |

* cited by examiner

*Primary Examiner* — Fritz Alphonse
(74) *Attorney, Agent, or Firm* — Robert M. Brush

(57) ABSTRACT

An example test circuit for an integrated circuit (IC) having a plurality of scan chains includes: a first circuit and a second circuit; and a scan chain router coupled between the first circuit and the plurality of scan chains and coupled between the second circuit and the plurality of scan chains, the scan chain router responsive to an enable signal to: (1) couple the first circuit to each of the plurality of scan chains; or (2) couple the second circuit to one or more concatenated scan chains, where each concatenated scan chain includes a concatenation of two or more of the plurality of scan chains.

20 Claims, 5 Drawing Sheets

DYNAMIC SCAN CHAIN RECONFIGURATION IN AN INTEGRATED CIRCUIT

TECHNICAL FIELD

Examples of the present disclosure generally relate to electronic circuits and, in particular, to dynamic scan chain reconfiguration in an integrated circuit (IC).

BACKGROUND

An integrated circuit (IC), such as an application specific integrated circuit (ASIC) or the like, are designed using design for testability (DFT) techniques. DFT techniques add testability features to a circuit design, such as scan chains. A scan chain is formed by a number of flip-flops ("flops") connected sequentially in a chain. The input of the first flop is connected to an input pin (a "scan-in") and the output of the last flop is connected to an output pin (a "scan-out"). Scan chains are inserted into designs to shift in test input data and shift out test result data.

IC manufacturers perform scan testing for various reasons, including to test stuck-at faults, to test the paths for delay (e.g., to determine if a path is operating at a functional frequency), and the like. Such scan testing is typically performed using automated test equipment (ATE) during manufacture. An IC can make use of scan compression to reduce the amount of data needed to test the IC, which frees up resources of the ATE and can reduce testing costs.

An IC can also be designed to perform self-testing using a logic built-in-self test (LBIST) feature. LBIST can test circuitry in the field and can test internal circuits that have no direct connections to external pins. LBIST can also provide test input to and receive test output from scan chains. An IC can perform LBIST upon being powered on.

Power-on LBIST typically exhibits run-time limitations so that the power-on time for a device meets specifications. To meet run-time limitations, LBIST can make use of smaller scan chains (e.g., scan chains having less flops). Conversely, manufacturing scan tests make use of larger scan chains (e.g., scan chains having more flops). For manufacturing scan tests, reducing scan chain length increases compression ratio. Increasing the compression ratio beyond a certain point affects test coverage. Thus, there is a conflict in terms of scan chain lengths in ICs that include both LBIST and manufacturing scan compression/decompression features.

SUMMARY

Techniques for providing dynamic scan chain reconfiguration in an integrated circuit (IC) are described. In an example, a test circuit for an integrated circuit (IC) having a plurality of scan chains includes: a first circuit and a second circuit; and a scan chain router coupled between the first circuit and the plurality of scan chains and coupled between the second circuit and the plurality of scan chains, the scan chain router responsive to an enable signal to: (1) couple the first circuit to each of the plurality of scan chains; or (2) couple the second circuit to one or more concatenated scan chains, where each concatenated scan chain includes a concatenation of two or more of the plurality of scan chains.

In another example, an integrated circuit (IC) includes a plurality of scan chains, and test circuitry coupled to the plurality of scan chains. The test circuitry includes: a first circuit and a second circuit; and a scan chain router coupled between the first circuit and the plurality of scan chains and coupled between the second circuit and the plurality of scan chains, the scan chain router responsive to an enable signal to: (1) couple the first circuit to each of the plurality of scan chains; or (2) couple the second circuit to one or more concatenated scan chains, where each concatenated scan chain includes a concatenation of two or more of the plurality of scan chains.

In another example, a method of testing an integrated circuit (IC) having a plurality of scan chains includes: receiving one or more test signals from automatic test equipment (ATE); decompressing the one or more test signals; concatenating the plurality of scan chains into one or more concatenated scan chains, each concatenated scan chain including a concatenation of two or more of the plurality of scan chains; coupling each of the one or more test signals to a respective one of the concatenated scan chains; and coupling an output of each of the one or more concatenated scan chains to the ATE.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

DETAILED DESCRIPTION

Figure 1:
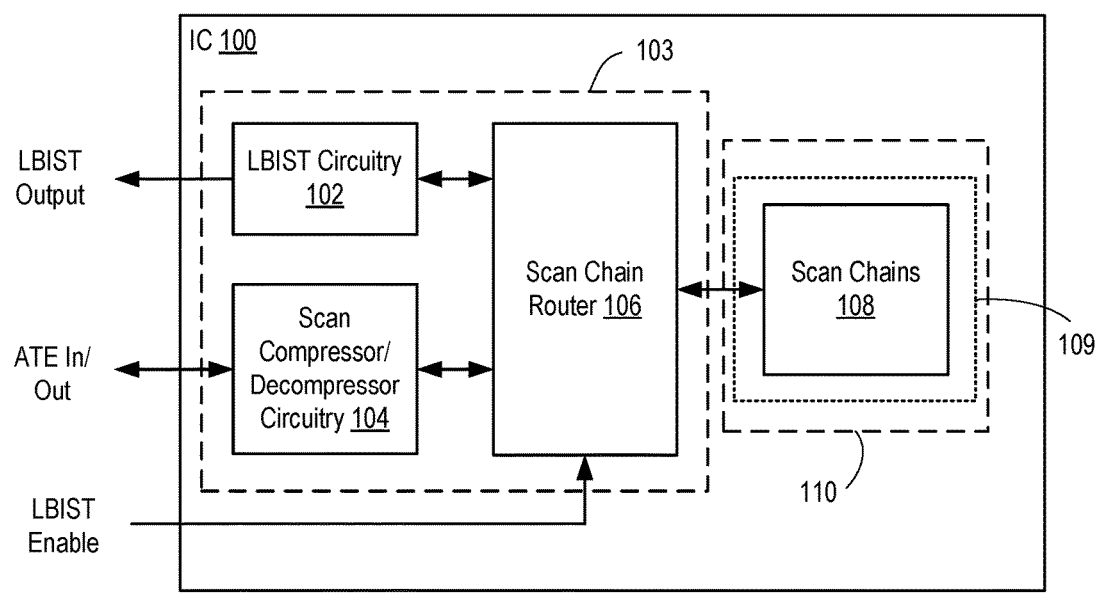
FIG. 1 is a block diagram depicting an integrated circuit (IC) according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for providing dynamic scan chain reconfiguration in an integrated circuit (IC) are described. In an example, an IC includes test circuitry having a scan chain router. The scan chain router can dynamically configure scan chains in the IC into chains of varying lengths for different modes of scan-related testing. For example, a power-on logic built-in self-test (LBIST) mode may need scan chains having shorter lengths to run faster for a quicker startup sequence. In contrast, a manufacturing scan test using automated test equipment (ATE) may need scan chains having longer lengths than those used for the LBIST mode, since manufacturing scan tests are limited in terms of the compression ratios. Beyond a certain compression ratio, it is more difficult to create test patterns using automatic test pattern generation (ATPG). In addition, for manufacturing scan tests, shorter scan chains (such as those needed by LBIST) can cause poor coverage or longer test times. The scan chain router described in examples herein supports both longer and shorter scan chains for various applications (e.g., both LBIST and manufacturing scan testing applications). These and further aspects are described below with respect to the drawings.

FIG. 1 is a block diagram depicting an integrated circuit (IC) 100 according to an example. The IC 100 includes test circuitry 103 and core logic 110. The core logic 110 includes a plurality of scan chains 108. Each of the scan chains 108 comprises a plurality of sequentially coupled flip-flops ("flops"). The test circuitry 103 includes logic built-in self-test (LBIST) circuitry 102, scan compressor/decompressor circuitry 104, and a scan chain router circuit ("scan chain router 106").

The scan chain router 106 is coupled between the scan chains 108 and the LBIST circuitry 102. The scan chain router 106 is also coupled between the scan chains 108 and the scan compressor/decompressor circuitry 104. The LBIST circuitry 102 provides an LBIST output. The scan compressor/decompressor circuitry 104 includes an automatic test equipment (ATE) input/output ("ATE In/Out"). The scan chain router 106 includes an input that receives an LBIST enable signal ("LBIST enable").

In operation, scan chain router 106 couples the scan chains 108 into scan chains of varying lengths for different testing modes. In a first testing mode ("LBIST mode"), the scan chain router 106 couples the scan chains 108 into scan chains having smaller lengths. In a second testing mode ("scan compressor/decompressor mode"), the scan chain router 106 couples the scan chains 108 into scan chains having longer lengths with respect to the LBIST mode ("concatenated scan chains 109").

In the LBIST mode, the scan chain router 106 couples the LBIST circuitry 102 to the scan chains 108. In the scan compressor/decompressor mode, the scan chain router 106 couples the scan compressor/decompressor circuitry 104 to the scan chains 108. ATE equipment (not shown in FIG. 1) can be coupled to the ATE in/out of scan compressor/decompressor 104 (e.g., during manufacture). The LBIST output of LBIST circuitry 102 can be accessed either directly or through another test circuit (e.g., a test access port (TAP) of Joint Test Action Group (JTAG) circuitry). In some cases, the ATE in/out of scan compressor/decompressor 104 is only accessible during manufacture of the IC 100 and is not accessible when the IC 100 is packaged. The LBIST output of LBIST circuitry 102 can be accessible both during manufacture and after the IC 100 is packaged.

The LBIST enable signal controls the mode of scan chain router 106. When LBIST enable is asserted, the scan chain router 106 is in the LBIST mode. When LBIST enable is de-asserted, the scan chain router 106 is in the scan compressor/decompressor mode. In an example, LBIST enable can be normally asserted and can be de-asserted during manufacture to perform ATE testing. LBIST enable can be accessible or inaccessible after the IC 100 is packaged.

Figure 2:
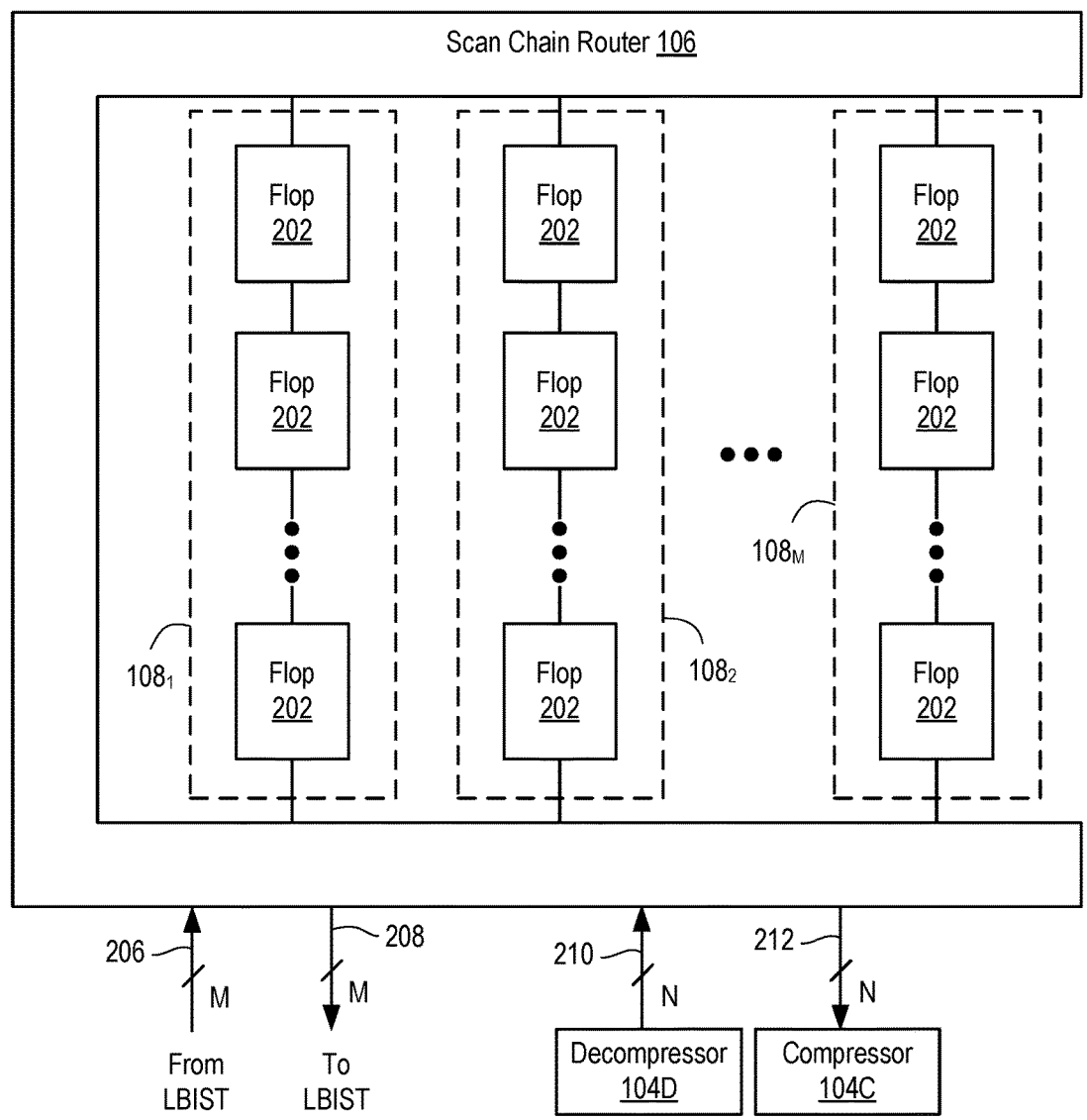
FIG. 2 is a block diagram depicting scan chains of the IC of FIG. 1 in more detail according to an example.

FIG. 2 is a block diagram depicting the scan chains 108 in more detail according to an example. In the example, scan chains 108 include separate scan chains $108_1 \ldots 108_M$, where M is an integer greater than one. Each scan chain $108_x$ ($x \in [1 \ldots K]$) includes a plurality of flops 202. The flops 202 of each scan chain $108_x$ (other than the last flop) are sequentially coupled output-to-input. The input of the first flop 202 in a scan chain $108_x$, and the output of the last flop 202 in a scan chain $108_x$, are coupled to the scan chain router 106.

The scan chain router 106 includes an M-bit input 206 coupled to the LBIST circuitry 102, and an M-bit output 208 coupled to the LBIST circuitry 102. In the LBIST mode, the M-bit input 206 includes an input test signal for each of the M scan chains $108_1 \ldots 108_M$. The M-bit output 208 includes an output test signal from each of the M scan chains $108_1 \ldots 108_M$. The scan chain router 106 passes the M test signals on the input 206 to input of the M scan chains $108_1 \ldots 108_M$, respectively. The scan chain router 106 passes the M outputs of the scan chains $108_1 \ldots 108_M$ as the M output test signals on the output 208, respectively.

The scan chain router 106 includes an N-bit input 210 coupled to a decompressor 104D of the scan decompressor/compressor circuitry 104. The scan chain router 106 includes an N-bit output 212 coupled to a compressor 104C of the scan decompressor/compressor circuitry 104. In general, N is an integer less than M. In the scan compressor/decompressor mode, the N-bit input 210 includes an input test signal for each of N concatenated scan chains 109. The N-bit output 212 includes an output test signal for each of the N concatenated scan chains 109. The scan chain router 106 is configured to concatenate a plurality of the scan chains 108 to form each of the N concatenated scan chains 109. For example, consider N=M/2 (e.g., the ratio of M to N is 2), where M is an even integer greater than zero. In such an example, scan chain router 106 concatenates pairs of the scan chains 108 to form concatenated scan chains 109 that are twice as long as an individual scan chain $108_x$. The ratio of M to N can be other integers greater than two (e.g., more than two scan chains 108 can be concatenated into a concatenated scan chain). Moreover, it is not necessary that each concatenated scan chain have the same length.

Figure 3:
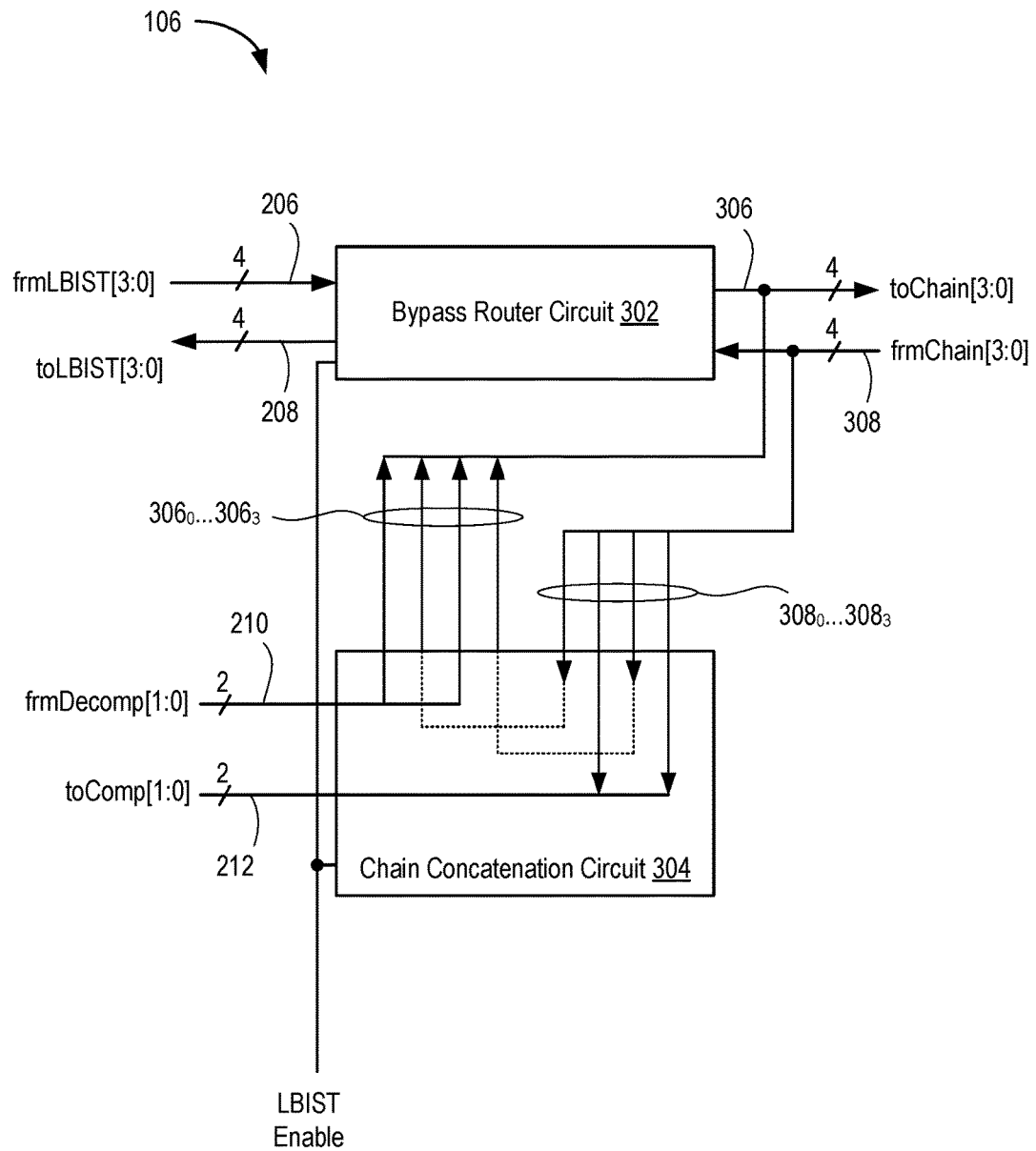
FIG. 3 is a block diagram depicting a scan chain router according to an example.

FIG. 3 is a block diagram depicting the scan chain router 106 according to an example. The scan chain router 106 includes a bypass router circuit 302 and a chain concatenation circuit 304. In the present example, assume M=4 and N=2. The bypass router circuit 302 is coupled to the output 208 and the input 206 of the LBIST circuitry 102. In this example, the output 208 of the LBIST circuitry 102 includes four signals ("frmLBIST[3:0]"). Likewise, the input 206 of the LBIST circuitry 102 includes four signals (toLIBST[3:0]"). The bypass router circuit 302 includes an output 306 and an input 308. The output 306 includes four outputs $306_0 \ldots 306_3$ (left-to-right in FIG. 3) that provide four signals ("toChain[3:0]"). Likewise, the input 308 includes four inputs $308_0 \ldots 308_3$ (left-to-right in FIG. 3) that provide four signals ("frmChain[3:0]"). The four signals of the output 306 are coupled to inputs four scan chains $108_1 \ldots 108_4$, respectively. The four signals of the input 308 are received from outputs of the scan chains $108_1 \ldots 108_4$, respectively.

The chain concatenation circuit 304 is coupled to the output 210 of the decompressor 104D and the input 212 of the compressor 104C. In this example, the output 210 includes two signals ("frmDecomp[1:0]"). Likewise, the input 212 includes two signals ("toComp[1:0]"). In the example, the chain concatenation circuit 304 couples the signal frmDecomp[0] to the output $306_0$ and the signal frmDecomp[1] to the output $306_2$. The chain concatenation circuit 304 couples the input $308_0$ to the output $306_1$. The chain concatenation circuit 304 couples the input $308_2$ to the output $306_3$. The chain concatenation circuit 304 provides the signal toComp[0] from the input $308_1$ and the signal toComp[1] from the input $308_3$.

In operation, the bypass router circuit 302 is enabled, and the chain concatenation circuit 304 is disabled, when the LBIST enable signal is asserted. The bypass router circuit 302 passes the signals frmLBIST[3:0] to the inputs of the scan chains $108_1 \ldots 108_4$. The bypass router circuit 302 passes signals output from the scan chains $108_1 \ldots 108_4$ as the signals toLBIST[3:0]. The bypass router circuit 302 is disabled, and the chain concatenation circuit 304 is enabled, when the LBIST enable signal is de-asserted. In such case, the chain concatenation circuit 304 concatenates scan chains $108_1$ and $108_2$ into a single concatenated chain 109. Likewise, the chain concatenation circuit 304 concatenates scan chains $108_3$ and $108_4$ into a single concatenated chain 109.

The example of FIG. 3 can be extended to support more than four scan chains 108. Further, the chain concatenation circuit 304 can concatenate more than two of the scan chains 108 to form each concatenated scan chain. Thus, each concatenated scan chain can be two, three, or more times longer than each individual scan chain 108.

Figure 4:
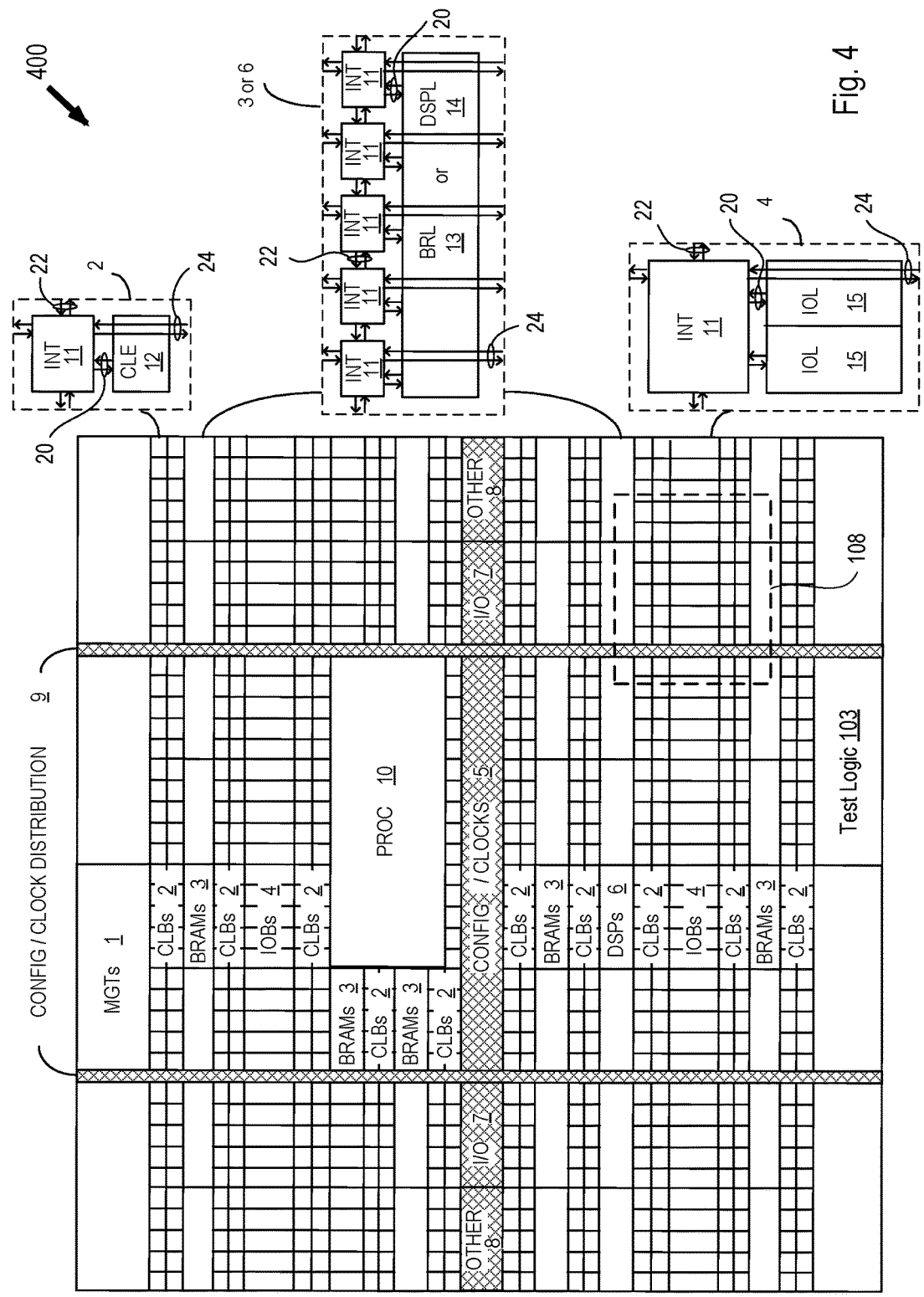
FIG. 4 illustrates a field programmable gate array (FPGA) in which test circuitry described herein can be used.

The test circuitry 103 described above can be implemented within an integrated circuit, such as a field programmable gate array (FPGA) or like type programmable circuit. FIG. 4 illustrates an architecture of FPGA 400 that includes a large number of different programmable tiles including multi-gigabit transceivers ("MGTs") 1, configurable logic blocks ("CLBs") 2, random access memory blocks ("BRAMs") 3, input/output blocks ("CLBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10. FPGA 400 can include scan chains 108 disposed throughout the programmable logic. The test circuitry 103 is coupled to the scan chains 108 as described above.

In some FPGAs, each programmable tile can include at least one programmable interconnect element ("INT") 11 having connections to input and output terminals 20 of a programmable logic element within the same tile, as shown by examples included at the top of FIG. 4. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An IOB 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 4) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 4 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 4 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 5:
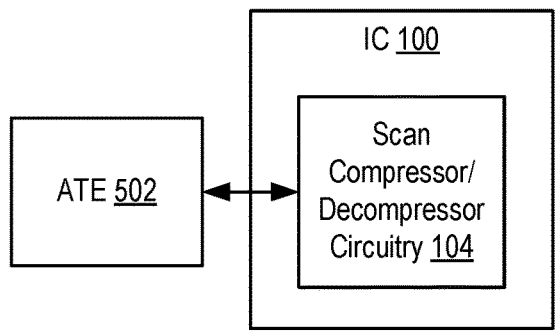
FIG. 5 depicts a system for testing the IC of FIG. 1 according to an example.
Figure 6:
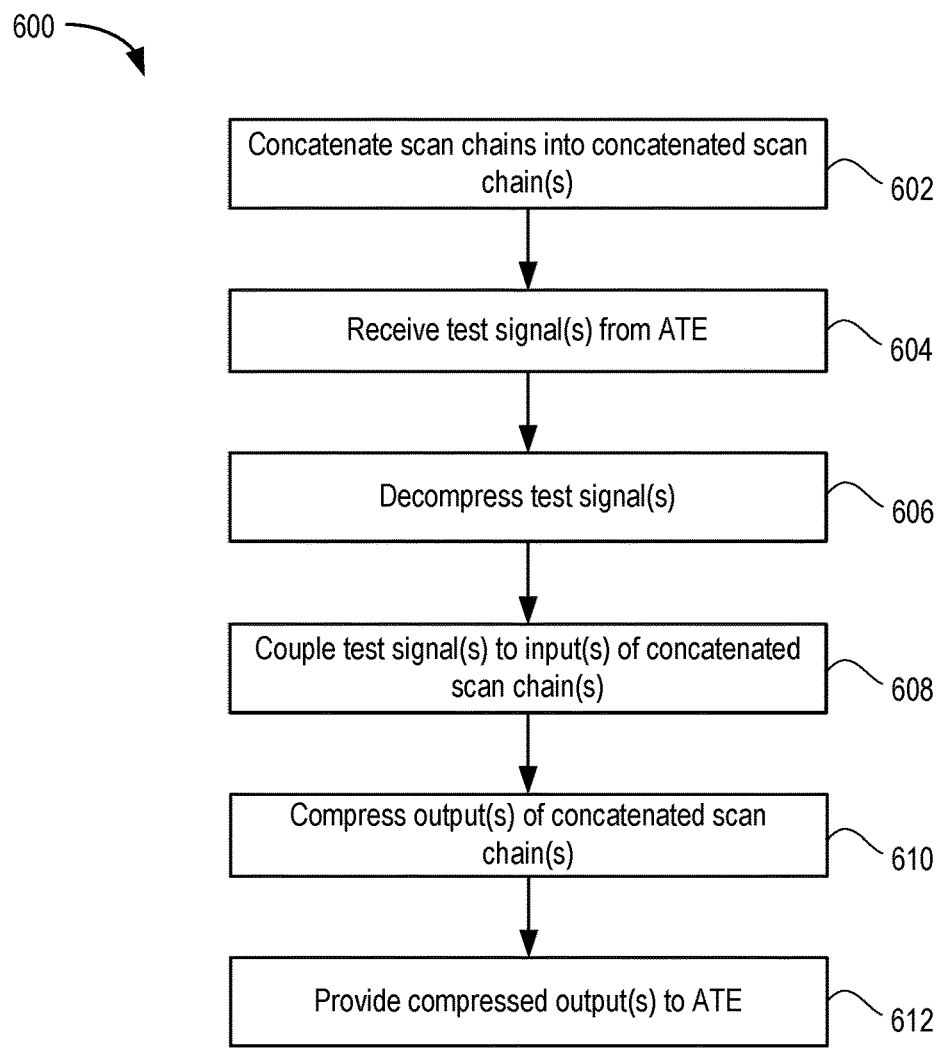
FIG. 6 is a flow diagram depicting a method for testing the IC of FIG. 1 according to an example To facilitate understanding, identical reference numerals have been used, where possible, to designate identical elements that are common to the figures. It is contemplated that elements of one example may be beneficially incorporated in other examples.

FIGS. 5 and 6 depict a system and method for testing the IC 100 according to an example. As shown in FIG. 5, the IC 100 can be coupled to ATE 502. The ATE 502 is coupled to the ATE in/out of the scan compressor/decompressor circuitry 104.

FIG. 6 depicts a method 600 of testing the IC 100 according to an example. The method 600 begins at step 602, where the scan chain router 106 concatenates the scan chains 108 to form concatenated scan chain(s) 109. In an example, the scan chain router 106 performs the concatenation in response to an enable signal (e.g., a static enable signal, such as the LBIST enable signal discussed above). The static enable signal enables the chain concatenation circuit 304 and disables the bypass router circuit 302.

At step 604, the decompressor 104D receives the test signal(s) from the ATE 502. At step 606, the decompressor 104D decompresses the test signal(s). At step 608, the scan chain router 106 couples the test signal(s) to input(s) of the concatenated scan chains 109. At step 610, the scan chain router 106 couples output(s) of the concatenated scan chains 109 to the compressor 104C, which compresses the output(s). At step 612, the compressor 104C provides the output(s) to the ATE 502.

While the foregoing is directed to specific examples, other and further examples may be devised without departing from the basic scope thereof, and the scope thereof is determined by the claims that follow.

What is claimed is:

1. A test circuit for an integrated circuit (IC) having a plurality of scan chains, the test circuit comprising:
   a first circuit and a second circuit; and
   a scan chain router coupled between the first circuit and the plurality of scan chains and coupled between the second circuit and the plurality of scan chains, the scan chain router responsive to an enable signal to: (1) couple the first circuit to each of the plurality of scan chains; or (2) couple the second circuit to one or more concatenated scan chains, where each concatenated scan chain includes a concatenation of two or more of the plurality of scan chains.

2. The test circuit of claim 1, wherein the first circuit comprises logic built-in self-test (LBIST) circuitry, and wherein the second circuit comprises scan compressor/decompressor circuitry.

3. The test circuit of claim 2, wherein the scan compressor/decompressor circuitry provides an interface between automated test equipment (ATE) and the scan chain router.

4. The test circuit of claim 1, wherein each of the plurality of scan chains comprises a plurality of sequentially coupled flip-flops disposed in core logic of the IC.

5. The test circuit of claim 1, wherein the scan chain router comprises:
   a bypass router circuit coupled between the first circuit and the plurality of scan chains; and
   a chain concatenation circuit coupled between the second circuit and the plurality of scan chains.

6. The test circuit of claim 5, wherein the first circuit includes an output having a plurality of output signals and an input having a plurality of input signals, and wherein the bypass router circuit is configured to couple each of the plurality of output signals to a respective one of the plurality of scan chains and to receive each of the plurality of input signals from a respective one of the plurality of scan chains.

7. The test circuit of claim 5, wherein the second circuit includes an output having one or more output signals and an input having one or more input signals, and wherein the chain concatenation circuit is configured to couple each of the one or more output signals to a respective one of the one of more concatenated scan chains and to receive each of the one or more input signals from a respective one or more of the concatenated scan chains.

8. The test circuit of claim 1, wherein the second circuit comprises:
   a decompressor that includes the output having the one or more output signals; and
   a compressor that includes the input having the one or more input signals.

9. An integrated circuit (IC), comprising:
   a plurality of scan chains; and
   test circuitry coupled to the plurality of scan chains, the test circuitry including:
      a first circuit and a second circuit; and
      a scan chain router coupled between the first circuit and the plurality of scan chains and coupled between the second circuit and the plurality of scan chains, the scan chain router responsive to an enable signal to: (1) couple the first circuit to each of the plurality of scan chains; or (2) couple the second circuit to one or more concatenated scan chains, where each concatenated scan chain includes a concatenation of two or more of the plurality of scan chains.

10. The IC of claim 9, wherein the first circuit comprises logic built-in self-test (LBIST) circuitry, and wherein the second circuit comprises scan compressor/decompressor circuitry.

11. The IC of claim 10, wherein the scan compressor/decompressor circuitry provides an interface between automated test equipment (ATE) and the scan chain router.

12. The IC of claim 9, wherein each of the plurality of scan chains comprises a plurality of sequentially coupled flip-flops disposed in core logic of the IC.

13. The IC of claim 9, wherein the scan chain router comprises:
   a bypass router circuit coupled between the first circuit and the plurality of scan chains; and
   a chain concatenation circuit coupled between the second circuit and the plurality of scan chains.

14. The IC of claim 13, wherein the first circuit includes an output having a plurality of output signals and an input having a plurality of input signals, and wherein the bypass router circuit is configured to couple each of the plurality of output signals to a respective one of the plurality of scan chains and to receive each of the plurality of input signals from a respective one of the plurality of scan chains.

15. The IC of claim 13, wherein the second circuit includes an output having one or more output signals and an input having one or more input signals, and wherein the chain concatenation circuit is configured to couple each of the one or more output signals to a respective one of the one of more concatenated scan chains and to receive each of the one or more input signals from a respective one or more of the concatenated scan chains.

16. The IC of claim 9, wherein the second circuit comprises:
   a decompressor that includes the output having the one or more output signals; and
   a compressor that includes the input having the one or more input signals.

17. A method of testing an integrated circuit (IC) having a plurality of scan chains, the method comprising:
   concatenating, by a scan chain router in the IC, the plurality of scan chains into one or more concatenated scan chains, each concatenated scan chain including a concatenation of two or more of the plurality of scan chains;
   receiving, at a decompressor in the IC, one or more test signals from automatic test equipment (ATE);
   decompressing, at the decompressor, the one or more test signals;
   coupling, by the scan chain router, each of the one or more test signals to a respective one of the concatenated scan chains; and
   coupling, by the scan chain router, an output of each of the one or more concatenated scan chains to the ATE.

18. The method of claim 17, further comprising:
   controlling an enable signal coupled to the scan chain router to perform the step of concatenating.

19. The method of claim 18, wherein the step of controlling comprises:
   enabling a chain concatenation circuit to perform the step of concatenating; and
   disabling a bypass router circuit.

20. The method of claim 19, wherein the bypass router circuit is coupled between a logic built-in self-test (LBIST) circuit and the plurality of scan chains.

* * * * *